(12) United States Patent
Nirschl et al.

(10) Patent No.: US 9,123,397 B2
(45) Date of Patent: Sep. 1, 2015

(54) CIRCUIT ARRANGEMENT AND METHOD FOR OPERATING A CIRCUIT ARRANGEMENT

(71) Applicant: Infineon Technologies AG, Neubiberg (DE)

(72) Inventors: Thomas Nirschl, Putzbrunn (DE); Philipp Hofter, Munich (DE)

(73) Assignee: Infineon Technologies AG, Neubiberg (DE)

( * ) Notice: Subject to any disclaimer, the term of this patent is extended or adjusted under 35 U.S.C. 154(b) by 46 days.

(21) Appl. No.: 13/969,810

(22) Filed: Aug. 19, 2013

(65) Prior Publication Data
US 2015/0049560 A1    Feb. 19, 2015

(51) Int. Cl.
*G11C 16/04* (2006.01)
*G11C 7/10* (2006.01)
G11C 16/26 (2006.01)
G11C 16/34 (2006.01)
H01L 27/115 (2006.01)

(52) U.S. Cl.
CPC  *G11C 7/10* (2013.01); *G11C 16/04* (2013.01); *G11C 16/26* (2013.01); *G11C 16/34* (2013.01); *H01L 27/115* (2013.01)

(58) Field of Classification Search
CPC ............... G11C 16/0483; G11C 16/10; G11C 16/3418; G11C 16/26; H01L 27/115

USPC .............. 365/185.17, 185.33, 185.05, 185.21
See application file for complete search history.

(56) References Cited

U.S. PATENT DOCUMENTS 7,471,567 B1 * 12/2008 Lee et al. .................. 365/185.21

OTHER PUBLICATIONS

Thomas Nirschl. "Circuit Arrangement and Method for Operating a Circuit Arrangement." U.S. Appl. No. 13/685,737, filed Nov. 27, 2012.

* cited by examiner

*Primary Examiner* — Jason Lappas
(74) *Attorney, Agent, or Firm* — Murphy, Bilak & Homiller, PLLC (57) ABSTRACT

A circuit arrangement comprising a plurality of electronic components; a plurality of first access lines and second access lines, wherein each electronic component is coupled with at least one first access line and second access lines, the second access lines comprising at least two bit-lines; an access controller controlling access to at least one of the electronic components via the at least one first access line and the second access lines; and a first group of switches, wherein each switch comprises at least one control terminal and at least two controlled terminals. Each switch of the first group is connected to one of the at least two bit-lines via its control terminal and in a path between one first access line and a sense amplifier via its controlled terminals, and adjacent switches are connected via their control terminals to different bit-lines of the at least two bit-lines.

26 Claims, 4 Drawing Sheets

CIRCUIT ARRANGEMENT AND METHOD FOR OPERATING A CIRCUIT ARRANGEMENT

TECHNICAL FIELD

Disclosed embodiments relate generally to a circuit arrangement, a method for operating such a circuit arrangement, and a corresponding system.

BACKGROUND OF THE INVENTION

Flash memories typically require a high voltage for modifying data. For example, a multiplexer circuit used for selecting a memory cell to be connected to a sense amplifier or to a write buffer circuit requires high voltage devices. If a sense amplifier is designed for lower voltages, it may need a protection device. The high voltage may be generated by a charge pump and leakage current of the multiplexer circuit may be reduced, in particular minimized.

High voltage devices have thicker gate oxides and larger channel widths and channel lengths than low-voltage devices, so that they can bear higher electric fields caused by the high voltages. As a result, high voltage devices have high threshold voltages and large device areas. The layout and the circuit architecture are therefore optimized to minimize the required area. On the other hand, low voltage devices show improved analog characteristics, and, due to thinner gate oxide, have better matching characteristics, which is important for building analog circuits, such as the sense amplifier. Therefore, the combination of high voltage and low voltage devices is beneficial for the combination of protection and accurate read operation. Because of rather poor characteristics of p-channel devices, n-channel devices may be used predominantly.

During a read operation, a memory cell is selected by means of a first access line, for example a bit-line, and a second access line, for example a word-line. First access lines of memory cells that are not used for selecting and accessing the memory cell may be kept at a defined bias, for example, by being connected to a defined potential, such as the ground potential. As a result, the read operation of the selected memory cell will not be disturbed by capacitive coupling with adjacent first access lines. Usually, n-channel devices are used for biasing the adjacent first access lines. The phrase "adjacent" is used in the specification to mean, e.g., "next to in location" or "neighboring".

Because the devices in the multiplexer circuit and the discharge devices have the same polarity, an additional bus with an inverted signal has to be routed. The bus is preferably designed for high voltages because the bit-line is biased to voltages larger than the break down voltage of the low voltage devices during write or erase operations. However, a high voltage design requires a high voltage level shifter for the control of the gates which requires area and consumes dynamic power during operation provided by the charge pumps. Typically, charge pumps draw a large current on a supply line conveying a supply voltage VDD. The use of p-channel devices for biasing is possible, however, a negative overdrive is required or the first access lines that are not used for selecting the memory cell are only weakly biased. This situation arises especially in scaled technology nodes where the supply voltage VDD is in the range of the threshold voltage of the high voltage devices.

SUMMARY

A first embodiment relates to a circuit arrangement comprising a plurality of electronic components; a plurality of first access lines and second access lines, wherein each electronic component is coupled with at least one first access line and second access lines, wherein the second access lines comprise at least two bit-lines; an access controller configured to control an access to at least one electronic component of the plurality of electronic components via the at least one first access line and the second access lines; a first group of switches, wherein each switch comprises at least one control terminal and at least two controlled terminals, wherein each switch of the first group of switches is connected to one of the at least two bit-lines via its control terminal and in a path between one first access line and a sense amplifier via its controlled terminals; wherein adjacent switches of the first group of switches are connected via their control terminals to different bit-lines of the at least two bit-lines.

A second embodiment relates to a method for operating a circuit arrangement, wherein the circuit arrangement comprises a plurality of electronic components; and a plurality of first access lines and second access lines. Each electronic component is coupled with at least one first access line and second access lines, wherein the second access lines comprise at least two bit-lines, wherein a first access line is selected; and wherein at least one first access line which is adjacent to the first access line selected is controlled to provide a discharge path.

A third embodiment relates to a system comprising a plurality of electronic components; a plurality of first access lines and second access lines, wherein each electronic component is coupled with at least one first access line and second access lines, wherein the second access lines comprise at least two bit-lines; means for selecting a first access line; and means for controlling at least one first access line which is adjacent to the first access line selected to provide a discharge path.

BRIEF DESCRIPTION OF THE DRAWINGS

Embodiments are shown and illustrated with reference to the drawings. The drawings serve to illustrate basic principles, so that only aspects necessary for understanding the basic principles are illustrated. The drawings are not to scale. In the drawings the same reference characters denote like features.

DETAILED DESCRIPTION OF THE PREFERRED EMBODIMENTS

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The words "adjacent" and "next" are not limited to horizontal arrangements or vertical arrangements only, but also include combinations in one or both directions. The words "adjacent" and "next" include electric coupling in all directions. In other words, the electric coupling can occur in three dimensions.

Figure 1:
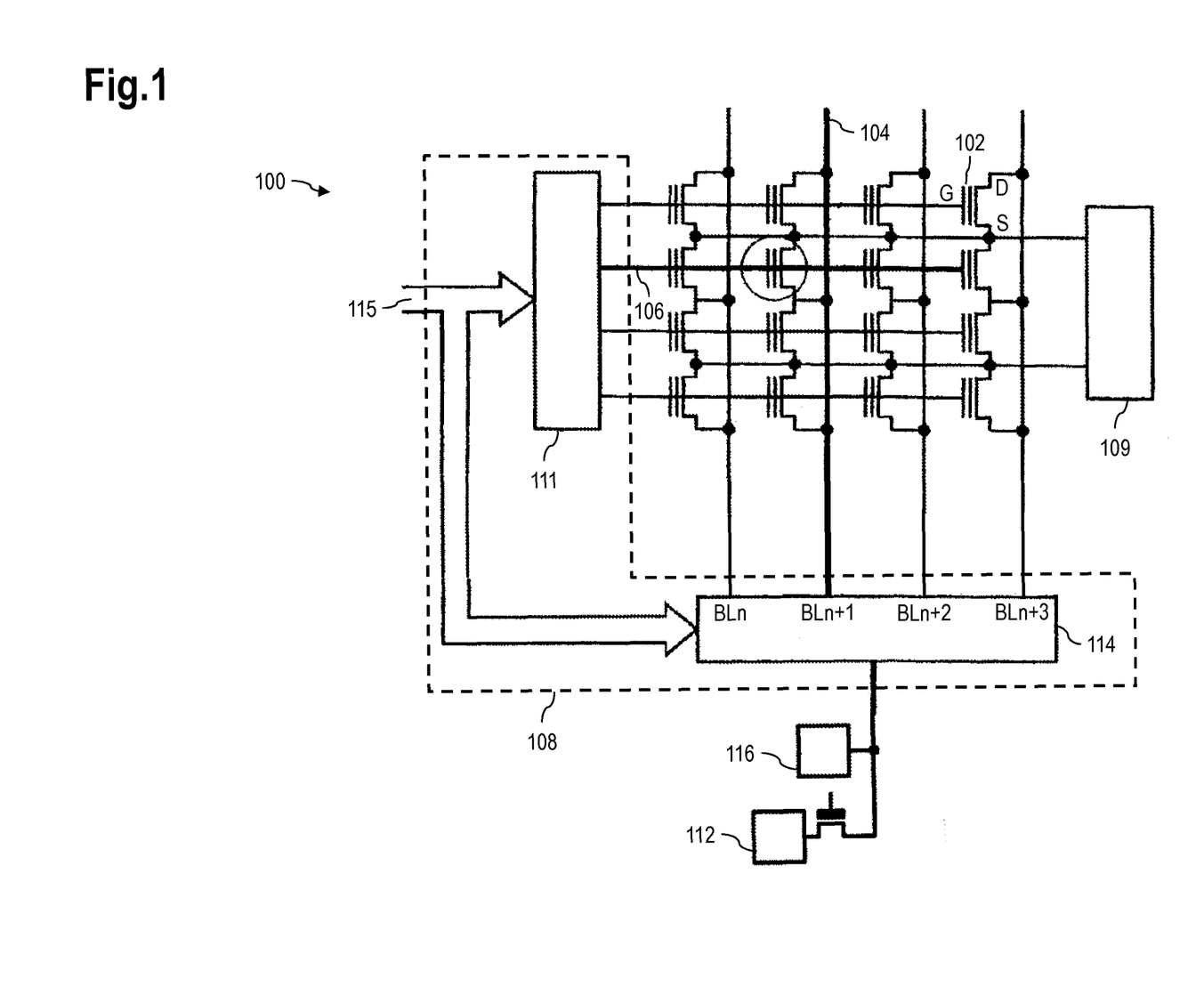
FIG. 1 shows an exemplary embodiment of a circuit arrangement.

FIG. 1 shows a circuit arrangement 100 with a plurality of electronic components 102 in accordance with various embodiments. For clarity purposes, not all electronic components 102 have been labeled with a reference sign 102. However, all elements presented with the same symbol as the electronic component referenced by reference sign 102 may also be considered as electronic components 102. The electronic components may be arranged in the form of a matrix. They may be arranged in columns in a first direction and in rows in a second direction. However, in various embodiments, the electronic components 102 may be arranged in any other arrangement, for example in a zigzag arrangement.

The electronic components 102 may be memory cells, for example volatile memory cells or non-volatile memory cells. The volatile memory cells may be dynamic random access memory (DRAM) cells or static random access memory (SRAM) cells. The non-volatile memory cells may be flash memory cells, for example floating gate memory cells or charge trapping memory cells, or resistive memory cells, for example magneto-resistive memory cells, phase change memory cells, conductive bridging memory cells or ferroelectric memory cells.

Moreover, the electronic components 102 may be sensor elements, for example biosensor elements. The biosensor elements may use antibodies as recognition elements to detect targets. Fluorescent antibodies may bind to the target and can be detected using a charge coupled device (CCD) camera.

Each electronic component 102 may include one or more transistors, e.g., at least one of the following
- a field effect transistor (FET),
- a metal oxide semiconductor field effect transistor (MOSFET),
- a metal insulator semiconductor field effect transistor (MISFET),
- a complementary metal oxide semiconductor field effect transistor (CMOSFET).

Each electronic component 102 may comprise
- at least one first control terminal, e.g., a gate terminal (G), and
- at least two controlled terminals, e.g., a first controlled terminal (e.g., a drain terminal (D)) and a second controlled terminal (e.g., a source terminal (S)).

Thus, in various embodiments, the control terminal G may be a gate terminal and one of the controlled terminals D may be a drain terminal and the other of the controlled terminals S may be a source terminal. For clarity purposes, the control terminals G and the controlled terminals D and S of the other electronic components 102 are not labeled. However, the other electronic components 102 may also have respective control terminals G and respective controlled terminals D and S.

The embodiment of the circuit arrangement 100 may have a plurality of first access lines 104 and may have a plurality of second access lines 106. For clarity purposes, not all first access lines and not all second access lines are provided with reference signs 104 and 106. However, all first access lines presented with the same structure as the first access line referenced by reference sign 104 are also considered first access lines 104 and all second access lines presented with the same structure as the second access line referenced by reference sign 106 are also considered second access lines 106.

The first access lines 104 may be bit-lines and the second access lines 106 may be bit-lines, e.g., word-lines. The first access lines 104 may be arranged along the first direction and the second access lines 106 may be arranged along the second direction, wherein the first direction forms a non-zero angle (in general an arbitrary angle, e.g., an angle of 90°) with the second direction. Thus, in various embodiments, the first access lines 104 may run perpendicular to the second access lines 106.

Each electronic component 102 may be coupled with at least one first access line 104 and at least one second access line 106. The at least one first access line 104 may be coupled to one of the two controlled terminals D and S and the at least one second access line 106 may be coupled to the control terminal G. Each electronic component 102 may be selected for access by a respective first access line 104 and a respective second access line 106 coupled to the electronic component 102.

While only sixteen electronic components 102 and four first access lines 104 and four second access lines 106 are exemplarily shown in FIG. 1, the circuit arrangement 100 may have a larger or smaller number of electronic components 102 with a corresponding larger or smaller number of first access lines 104 and a corresponding larger or smaller number of second access lines 106. For example, there may be hundreds, thousands, or even millions of electronic components 102 and first and second access lines 104, 106.

The circuit arrangement 100 may have an access controller 108. The access controller 108 may comprise a word line decoder 111 (also referred to as row decoder) and at least one first multiplexer circuit 114 (also referred to as column decoder). The access controller 108 may be configured to control an access to at least one electronic component 102 by selecting the electronic component 102 via the first access line 104 and the second access line 106 that are coupled to the electronic component 102.

The word line decoder 111 may be physically located on one side of the matrix comprising the electronic components 102 or it may be distributed among at least two sides of this matrix. The multiplexer circuit 114 may be physically located on one side of the matrix comprising the electronic components 102 or it may be distributed among at least two sides of this matrix.

The multiplexer circuit 114 may be connected to the plurality of first access lines 104 and may select one of the first access lines 104. The multiplexer circuit 114 may couple the selected first access line 104 to a sense amplifier 112 or to a write buffer circuit 116, or to both.

The word line decoder 111 may be connected to the plurality of second access lines 106 and may select one of the second access lines 106. It may select the second access line 106 by applying a voltage to it. The voltage may be a voltage that allows a conduction of electric current between the controlled terminals D and S of the electronic component 102. The word line decoder 111 may apply another voltage to the second access line 106 that is not selected. The other voltage may be a voltage that does not allow a conduction of electric current between the controlled terminals D and S of the electronic component 102.

The multiplexer circuit 114 may be connected to the plurality of first access lines 104 and it may select one of the first access lines 104. The multiplexer circuit 114 may couple the selected first access line 104 to a sense amplifier 112 or to a write buffer circuit 116, or to both. The word line decoder 111 may be connected to the plurality of second access lines 106 and may select one of the second access lines 106. It may select the second access line 106 by applying a voltage to it.

The voltage may be a voltage that allows a conduction of an at least first electric current between the controlled terminals D and S of the electronic component 102. The word line decoder 111 may apply another voltage to the second access lines 106 that are not selected. The other voltage may be a voltage that allows a conduction of an at least second electric current between the controlled terminals D and S of the electronic component 102.

The access controller 108 may obtain an address 115 as an input. The address 115 may determine which of the first access lines 104 is selected by the multiplexer circuit 114 and which of the second access lines 106 is selected by the word line decoder 111. The access controller 108 may select one of the electronic components 102 for, e.g., a read access or for a write access.

The row decoder 111 may select at least two rows to one sensing circuit for simultaneous read operations. The row decoder 111 selects at least two rows to one write buffer for simultaneous write operations.

As an example, the bit-line 104 that is labeled BLn is adjacent to a bit-line 104 labeled BLn+1 (n being an integer number greater than zero). It is arranged on a first side, here on the left side, with respect to the bit-line 104 labeled BLn+1. A bit-line 104 labeled BLn+2 is also adjacent to the bit-line labeled BLn+1. It is arranged on a second side, here on the right side, with respect to the bit-line 104 labeled BLn+1.

The circuit arrangement 100 may have a source switch 109. The source switch 109 may be configured to provide one or more bias potentials to the other controlled terminals S of the plurality of electronic components 102. The bias potential may depend on the operation performed on the selected electronic component 102. The bias potential may be the same, such as for example, a ground potential, for reading and writing the selected electronic component 102. The bias potential may be a high voltage for erasing the selected electronic component 102.

Figure 2:
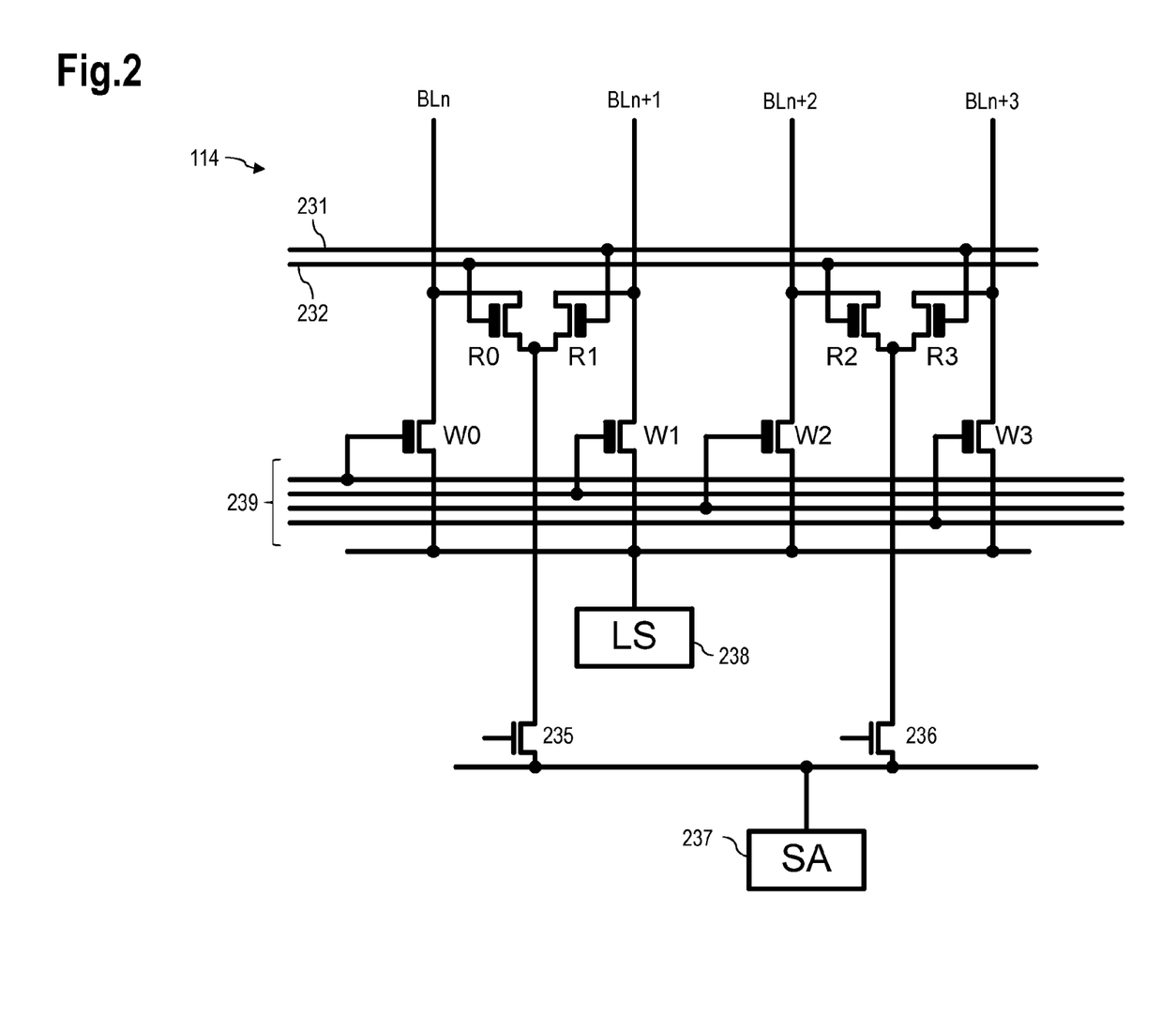
FIG. 2 shows an exemplary implementation of the multiplexer circuit with two bit-lines that allow for addressing switches in an alternating order.

FIG. 2 shows an exemplary implementation of the multiplexer circuit 114, which may correspond to the multiplexer circuit 114 of the circuit arrangement 100 shown in FIG. 1. The description of the multiplexer circuit 114 given in conjunction with FIG. 1 may apply to FIG. 2, and vice versa.

The multiplexer circuit 114 may have two bit-lines 231 and 232 (which may be regarded as part of the second access lines) and a plurality of switches R0, R1, R2 and R3. Also, the first access lines (bit-lines) 104 of FIG. 1 are shown and are labeled BLn, BLn+1, BLn+2 and BLn+3. Each of the switches R0 to R3 has a control terminal G (gate) and two controlled terminals D (drain) and S (source) as described with regard to FIG. 1.

The control terminal of the switch R0 is connected to the bit-line 232, the control terminal of the switch R1 is connected to the bit-line 231, the control terminal of the switch R2 is connected to the bit-line 232 and the control terminal of the switch R3 is connected to the bit-line 231. The controlled terminal D of the switch R0 is connected to the bit-line BLn, the controlled terminal D of the switch R1 is connected to the bit-line BLn+1, the controlled terminal D of the switch R2 is connected to the bit-line BLn+2 and the controlled terminal D of the switch R3 is connected to the bit-line BLn+3.

The controlled terminals S of the switches R0 and R1 are connected with each other and with the controlled terminal D of a switch 235. The controlled terminals S of the switches R2 and R3 are connected with each other and with the controlled terminal D of a switch 236. The controlled terminals S of the switches 235 and 236 are connected with each other and to a sense amplifier 237.

Hence, the bit-lines 231 and 232 allow for a hierarchical addressing scheme of adjacent bit-lines. Alternatively, more devices can be used as a first stage of the multiplexer circuit 114.

The multiplexer circuit 114 may be connected between the plurality of first access lines 104 and at least one of at least one sense amplifier 237 and at least one write buffer circuit 238 (also referred to as level shifter).

FIG. 2 also shows several switches W0 to W3, wherein the control terminal G of each of the switches W0 to W3 is connected to one of the select-lines 239 (which may also be regarded as part of the second access lines). The select-lines 239 may carry signals for the control terminals of the switches W0 to W3 for the selection of a first access line 104. The signals may be derived from an address 115, as shown in and described in conjunction with FIG. 1.

Hence, the controlled terminal D of the switch W0 is connected to the bit-line BLn and the controlled terminal S of the switch W0 is connected to the level shifter 238. The controlled terminal D of the switch W1 is connected to the bit-line BLn+1 and the controlled terminal S of the switch W1 is connected to the level shifter 238. The controlled terminal D of the switch W2 is connected to the bit-line BLn+2 and the controlled terminal S of the switch W2 is connected to the level shifter 238. The controlled terminal D of the switch W3 is connected to the bit-line BLn+3 and the controlled terminal S of the switch W3 is connected to the level shifter 238.

One of the controlled terminals of each of the switches R0 to R3 may be coupled to a respective first access line 104 and the other of the two controlled terminals of each of the switches R0 to R3 may be coupled via a switch (235 or 236) to the sense amplifier 237.

Accordingly, one of the controlled terminals of each of the switches W0 to W3 may be coupled to a respective first access line 104 and the other of the two controlled terminals of each of the switches W0 to W3 may be coupled to the level shifter 238.

In the example of FIG. 2, the first access lines 104 correspond to said bit-lines BLn to BLn+1. The select-lines 239 are used to control the control terminals of the switches W0 to W3 and the bit-lines 231 and 232 are used to control the control terminals of the switches R0 to R3. One of the select-lines may be connected to one of the switches W0 to W3. The bit-lines 231 and 232 are connected in an alternating manner to control terminals of adjacent switches R0 to R3. In other words, adjacent switches from the set of switches R0 to R3 are controlled via different bit-lines 231, 232.

It is noted that a different number of bit-lines can be used to introduce an alternating order depending on, e.g., the arrangement of adjacent switches. Hence, if one of the switches is selected for a read or write operation, a discharge path for at least one adjacent switch may be selected.

The switches R0 to R3 may be utilized for conducting a read operation. The switches W0 to W3 may be utilized for conducting a write operation.

If one of the switches is closed, for example under the influence of a signal applied to its control terminal, the respective first access line 104 may be coupled to the sense amplifier 237 or the level shifter 238. An electronic component 102 that is coupled to the respective first access line 104 may thus be read by means of the sense amplifier 237 or it may be written by means of the level shifter 238.

It is in particular suggested to provide a selective discharge of only those bit-lines disturbing a read operation or a write operation (i.e., adjacent bit-lines to the bit-lines that are selected for read or write operation, also referred to as "direct neighbors"). Other bit-lines that are not selected or are not adjacent bit-lines to the one selected for read or write operation may remain floating, i.e., no fixed electric voltage may be imposed on them.

Figure 3:
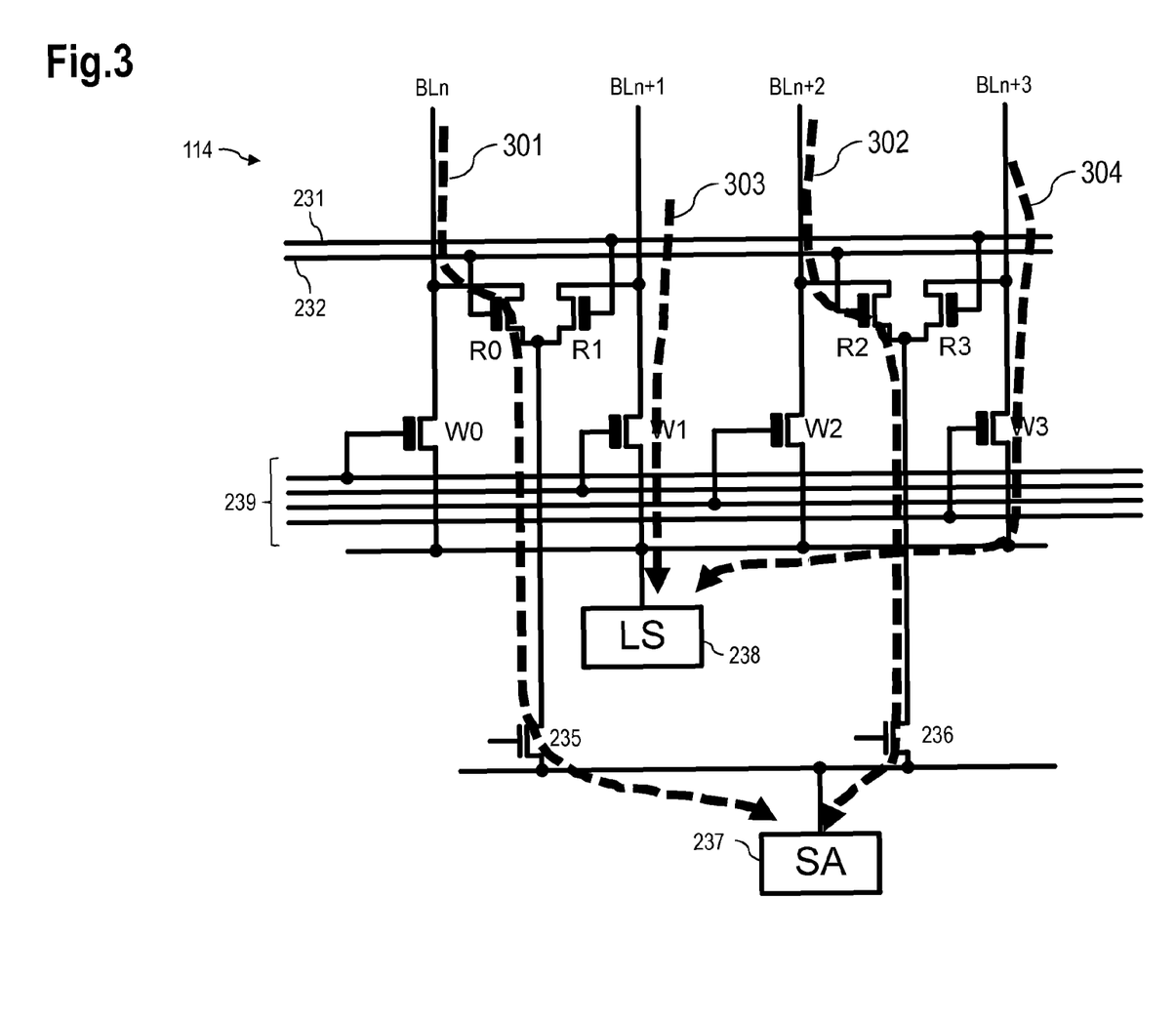
FIG. 3 shows the circuit diagram of FIG. 2 during a read operation.

FIG. 3 shows the circuit diagram of FIG. 2 during a read operation. A signal path 301 shows a first data portion that is conveyed via bit-line BLn, passing the switch R0 and the switch 235 and is detected at the sense amplifier 237. A signal path 302 shows a second data portion that is conveyed via the bit-line BLn+2 passing the switch R2 and the switch 236 and is detected at the sense amplifier 237. The first data portion and the second data portion could be read after each other, wherein the switches 235 and 236 can be used to decide which of the first and second data portions should be read at a particular time.

The bit-line 232 is activated, thereby closing the switches R0 and R2. The bit-line 231 is not activated, which prevents a signal from the bit-line BLn+1 and BLn+3 to reach the switches 235 and 236.

However, adjacent bit-lines could be used as discharge paths 303 and 304. During the read operation, the hardware of the write operation can be used to discharge adjacent bit-lines.

The two bit-lines 231 and 232 can be understood as selection means for dividing adjacent bit-lines BLn (with n being an integer) into a first group of bit-lines and a second group of bit-lines, wherein one bit-line of the first group has at least one neighboring bit-line of the second group and vice-versa. Considering two bit-lines 231 and 232, the bit-lines BLn could be separated in odd and even bit-lines (when being enumerated by integer values). If only one of the bit-line 231, 232 is active, every second switch utilized for read operations is active and data could be read via the respective bit-line BLn by the sense amplifier 237. In such case, the respective other of the two bit-lines 232, 231 is not active, which results in that the respective other switch connected via the same bit-line to the sense amplifier 237 is not in a conducting mode. Hence, a single connection for two switches R0, R1 (or R2, R3) to the sense amplifier 237 can be used by activating one or the other of the switches R0 and R1.

In addition, the switches W0 to W3 used for write operations can be utilized via the select lines 239: The switch W1 and the switch W3 are activated via the select lines 239, thereby closing a discharge path from the bit-line BLn+1 to the level shifter 238 and from the bit-line BLn+3 to the level shifter 238.

It is an option, however, that more than two bit-lines 231 and 232 are provided for selecting at least one of the switches R0 to R3. Various coding schemes could be used to address one or more than one from a group of more than two switches that may in particular share a common connection towards the sense amplifier.

During the read operation, the bit-lines BLn may be charged at a first step; it may thus not be important at which bias the not-selected bit-lines were prior to this first step.

Advantageously, a single polarity signal and devices of one polarity may be used (either n-channel or p-channel devices). Such devices may share the same active area on a chip. Preferably, a continuous active area may be used to reduce or minimize the overall area required as well as to reduce or minimize stress effects.

Figure 4:
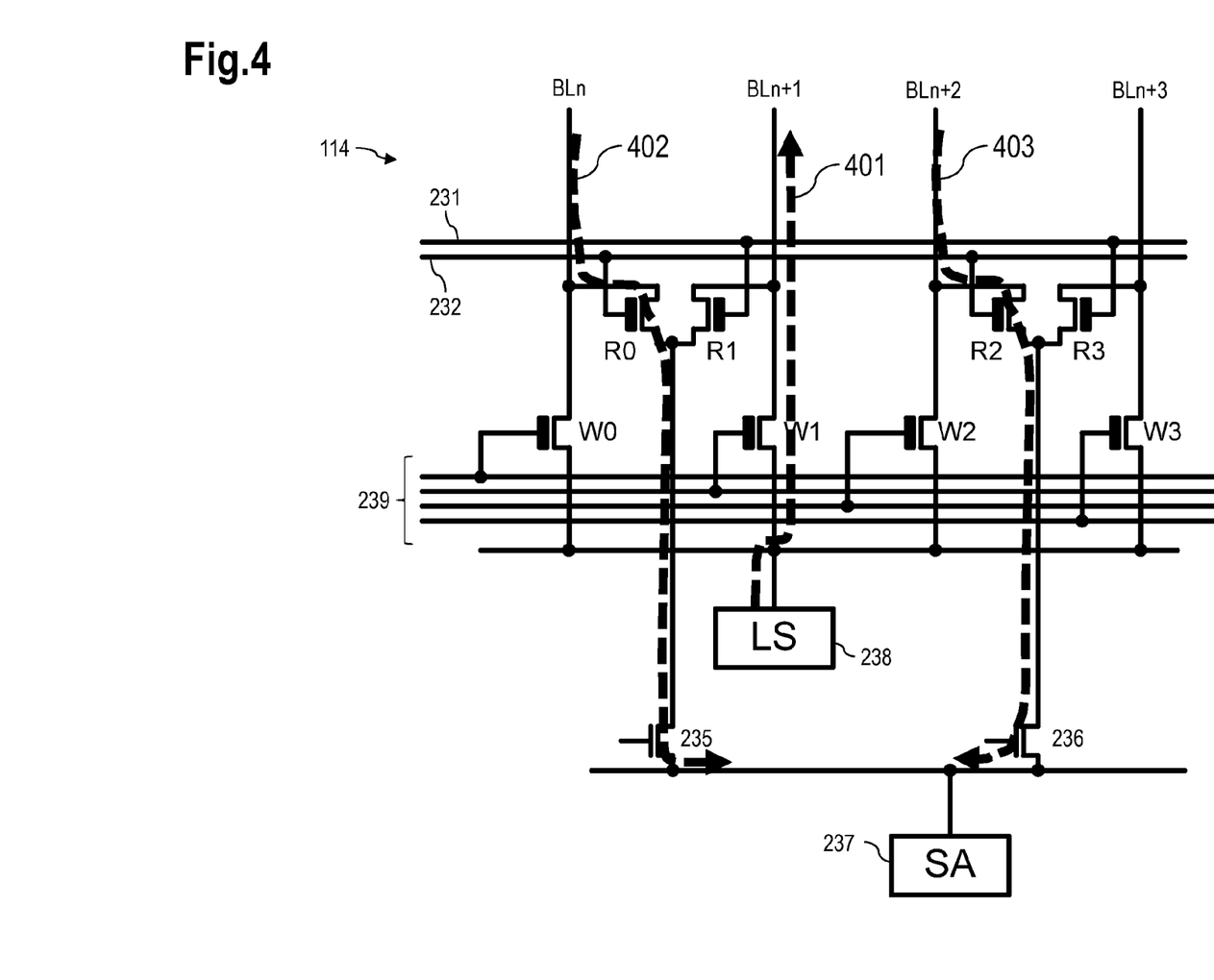
FIG. 4 shows the circuit diagram of FIG. 2 during a write operation.

FIG. 4 shows the circuit diagram of FIG. 2 during a write operation. A write path 401 shows a data portion that is conveyed from the level shifter 238 via the bit-line BLn+1 towards a memory cell (not shown in FIG. 4). The read paths of adjacent bit-lines BLn and BLn+2 are utilized as discharged paths 402 and 403. Hence, during the write operation, the circuitry of the read operation is used to discharge adjacent bit-lines.

Advantageously, the solution presented suggests a circuit that enables low power burst read operation, because a data word may be decoded with a low voltage signal. Only the first address jump may require high voltage signal switching. For example, an ECC word (ECC: error correction code) can be read in several parts (i.e., in a burst mode).

It is also an advantage that the number of low voltage devices can be reduced as well. A pre-decoding can be conducted by high voltage or medium voltage devices. High voltage in this regard may refer to voltages exceeding approximately 1.3 Volts. Medium voltage may refer to a voltage range of approximately 1.2 Volts to 1.3 Volts.

While only four first access lines 104 with four switches R0 to R3 and four switches W0 to W3 are shown in FIG. 2 to FIG. 4, the multiplexer 114 may have a larger or smaller number of first access lines 104 with a corresponding larger or smaller number of switches.

The switches shown in FIG. 2 can at least partially be realized as field effect transistors (FETs). They may be n-type FETs or p-type FETs. They may be arranged in the same well. The well may be arranged in a substrate of the circuit arrangement 100. The switches may in particular share a common active area, that is, they may share the physical part of the circuit arrangement 100 in which the active elements are arranged.

As the switches share the same signal at their control terminals, only one polarity of the signal may be required. There may be no need for an additional high-voltage bus. No inverted signal may need to be routed so that the device area and the dynamic power consumption of the circuit arrangement 100 can be reduced.

At least one of the following examples and/or embodiments may be considered innovative. They might be combined with other aspects or embodiments as described. Any embodiment or design described herein is not necessarily to be construed as preferred or advantageous over other embodiments or designs.

A circuit arrangement is provided comprising:
a plurality of electronic components;
a plurality of first access lines and second access lines, wherein each electronic component is coupled with at least one first access line and second access lines, wherein the second access lines comprise at least two bit-lines;
an access controller configured to control an access to at least one electronic component of the plurality of electronic components via the at least one first access line and the second access lines;
a first group of switches, wherein each switch comprises at least one control terminal and at least two controlled terminals, wherein each switch of the first group of switches is connected
to one of the at least two bit-lines via its control terminal and
in a path between one first access line and a sense amplifier via its controlled terminals;
wherein adjacent switches of the first group of switches are connected via their control terminals to different bit-lines of the at least two bit-lines.

In an embodiment,
the second access lines comprise select-lines,
the circuit arrangement comprises a second group of switches, wherein each switch comprises at least one control terminal and at least two controlled terminals, wherein each switch of the second group of switches is connected
to one of the select-lines via its control terminal and
in a path between one first access line and a level shifter via its controlled terminals.

In an embodiment, the access controller comprises the second group of switches.

In an embodiment, the access controller is configured to, during a read operation:
activate only the switches of the first group that are connected to one of the at least two bit-lines and not activate the switches of the first group that are connected to the at least other one of the at least two bit lines; and
activate via the select-lines at least one switch of the second group that is connected to at least one first access line that is adjacent to the first access line that is selected for a read operation, thereby enabling at least one discharge path adjacent to the switch of the first group that is selected for the read operation.

In an embodiment, the access controller is configured to, during a read operation:
select at least one path from one first access line to the sense amplifier by activating at least one switch of the first group via at least one of the at least two bit lines; and
activate via the select-lines at least one switch of the second group that is connected to at least one first access line that is adjacent to the first access line that is selected for a read operation, thereby enabling at least one discharge path adjacent to the switch of the first group that is selected for the read operation.

In an embodiment, the path selected comprises an additional switch that allows selecting one out of at least two first access lines to be connected to the sense amplifier.

In an embodiment, the access controller is configured to, during a write operation:
activate via the select-lines at least one switch of the second group that is connected to at least one first access line to be selected for the write operation and not activate the switch of the first group that is connected to this first access line; and
activate at least one of the switches of the first group that are connected to the first access lines that are adjacent to the first access line selected for the write operation, thereby enabling at least one discharge path.

In an embodiment, the switches of the first group and the switches of the second group at least partially share the same active area.

In an embodiment, the access controller comprises the first group of switches.

In an embodiment,
two adjacent switches of the first group of switches are connected via their respective control terminal to different bit-lines;
the two adjacent switches are connected via one of their respective controlled terminals to different first access lines,
the two adjacent switches are connected to each other via an additional of their respective controlled terminals and further via at least one additional switch to the sense amplifier.

In an embodiment, the additional switch is controlled by the access controller.

In an embodiment, the access controller is arranged to activate only one of the at least two bit-lines at the same time.

In an embodiment, the electronic component comprise at least one of:

a volatile memory cell selected from a group consisting of dynamic random access memory cells and static random access memory cells;
a non-volatile memory cell selected from a group consisting of flash memory cells and resistive memory cells; and a plurality of sensor elements;
a sensor element, in particular a biosensor element.

In an embodiment, the switch comprises at least one field effect transistor.

In an embodiment, the field effect transistors are of the same conductivity type.

In an embodiment, the field effect transistors are at least partially arranged in the same well.

A method is provided for operating a circuit arrangement, wherein the circuit arrangement comprises
a plurality of electronic components; and
a plurality of first access lines and second access lines, wherein each electronic component is coupled with at least one first access line and second access lines, wherein the second access lines comprise at least two bit-lines;
the method comprising the steps:
selecting a first access line;
controlling at least one first access line which is adjacent to the first access line selected to provide a discharge path.

In an embodiment,
the least one first access line which is adjacent to the first access line selected is controlled to provide a discharge path by activating at least one switch of a first group of switches, wherein each switch comprises at least one control terminal and at least two controlled terminals,
each switch of the first group of switches is connected
to one of the at least two bit-lines via its control terminal and
in a path between one first access line and a sense amplifier via its controlled terminals,
adjacent switches of the first group of switches are connected via their control terminals to different bit-lines of the at least two bit-lines.

In an embodiment, the discharge path is controlled to connect a level shifter to at least one first access line adjacent to the first access line selected.

In an embodiment, the discharge path is controlled to connect a level shifter to at least one first access line adjacent to the first access line selected at the beginning of or during a read operation.

In an embodiment,
the second access lines comprise select-lines,
the circuit arrangement comprises a second group of switches, wherein each switch comprises at least one control terminal and at least two controlled terminals, wherein each switch of the second group of switches is connected
to one of the select-lines via its control terminal and
in a path between one first access line and a level shifter via its controlled terminals,
the method further comprises the steps:
activating only the switches of the first group that are connected to one of the at least two bit-lines and not activating the switches of the first group that are connected to the at least other one of the at least two bit lines; and
activating via the select-lines at least one switch of the second group that is connected to at least one first access line that is adjacent to the first access line that is selected for a read operation, thereby enabling at least one discharge path adjacent to the switch of the first group that is selected for the read operation.

In an embodiment, the second access lines comprise select-lines, the circuit arrangement comprises a second group of switches, wherein each switch comprises at least one control terminal and at least two controlled terminals, wherein each switch of the second group of switches is connected
- to one of the select-lines via its control terminal and
- in a path between one first access line and a level shifter via its controlled terminals, the method further comprises the steps:
- selecting at least one path from one first access line to the sense amplifier by activating at least one switch of the first group via at least one of the at least two bit lines; and
- activating via the select-lines at least one switch of the second group that is connected to at least one first access line that is adjacent to the first access line that is selected for a read operation thereby enabling at least one discharge path adjacent to the switch of the first group that is selected for the read operation.

In an embodiment, the discharge path is controlled to connect a sense amplifier to at least one first access line adjacent to the first access line selected.

In an embodiment, the discharge path is controlled to connect a sense amplifier to at least one first access line adjacent to the first access line selected during a write operation.

In an embodiment, the second access lines comprise select-lines, the circuit arrangement comprises a second group of switches, wherein each switch comprises at least one control terminal and at least two controlled terminals, wherein each switch of the second group of switches is connected
- to one of the select-lines via its control terminal and
- in a path between one first access line and a level shifter via its controlled terminals, the method further comprises the steps:
- activating via the select-lines at least one switch of the second group that is connected to at least one first access line to be selected for the write operation and not activating the switch of the first group that is connected to this first access line; and
- activating at least one of the switches of the first group that are connected to the first access lines that are adjacent to the first access line selected for the write operation thereby enabling at least one discharge path.

A system is provided, said system comprising
a plurality of electronic components;
a plurality of first access lines and second access lines, wherein each electronic component is coupled with at least one first access line and second access lines, wherein the second access lines comprise at least two bit-lines;
means for selecting a first access line; and
means for controlling at least one first access line which is adjacent to the first access line selected to provide a discharge path.

In an embodiment, the system comprises means for controlling the discharge path to connect a level shifter to at least one first access line adjacent to the first access line selected at the beginning of or during a read operation.

In an embodiment, the system comprises means for controlling the discharge path to connect a sense amplifier to at least one first access line adjacent to the first access line selected during a write operation.

In an embodiment, the system
comprises means for controlling the least one first access line which is adjacent to the first access line selected to provide a discharge path by activating at least one switch of a first group of switches, wherein each switch comprises at least one control terminal and at least two controlled terminals,
wherein each switch of the first group of switches is connected
- to one of the at least two bit-lines via its control terminal and
- in a path between one first access line and a sense amplifier via its controlled terminals,
comprises means for connecting adjacent switches of the first group of switches via their control terminals to different bit-lines of the at least two bit-lines.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A circuit arrangement comprising:
a plurality of electronic components;
a plurality of first access lines and second access lines, wherein each electronic component is coupled with at least one first access line and second access lines, wherein the second access lines comprise at least two bit-lines;
an access controller configured to control an access to at least one electronic component of the plurality of electronic components via the at least one first access line and the second access lines;
a first group of switches, wherein each switch comprises at least one control terminal and at least two controlled terminals, wherein each switch of the first group of switches is connected
- to one of the at least two bit-lines via its control terminal and
- in a path between one first access line and a sense amplifier via its controlled terminals;
wherein adjacent switches of the first group of switches are connected via their control terminals to different bit-lines of the at least two bit-lines.

2. The circuit arrangement according to claim 1,
wherein the second access lines comprise select-lines,
wherein the circuit arrangement comprises a second group of switches, wherein each switch comprises at least one control terminal and at least two controlled terminals,
wherein each switch of the second group of switches is connected
to one of the select-lines via its control terminal and in a path between one first access line and a level shifter via its controlled terminals.

3. The circuit arrangement according to claim 2, wherein the access controller comprises the second group of switches.

4. The circuit arrangement according to claim 2, wherein the access controller is configured to, during a read operation,
activate only the switches of the first group that are connected to one of the at least two bit-lines and not to activate the switches of the first group that are connected to the at least other one of the at least two bit lines; and
activate via the select-lines at least one switch of the second group that is connected to at least one first access line that is adjacent to the first access line that is selected for a read operation, thereby enabling at least one discharge path adjacent to the switch of the first group that is selected for the read operation.

5. The circuit arrangement according to claim 2, wherein the access controller is configured to, during a read operation,
select at least one path from one first access line to the sense amplifier by activating at least one switch of the first group via at least one of the at least two bit lines; and
activate via the select-lines at least one switch of the second group that is connected to at least one first access line that is adjacent to the first access line that is selected for a read operation, thereby enabling at least one discharge path adjacent to the switch of the first group that is selected for the read operation.

6. The circuit arrangement according to claim 5, wherein the path selected comprises an additional switch that allows selecting one out of at least two first access lines to be connected to the sense amplifier.

7. The circuit arrangement according to claim 2, wherein the access controller is configured to, during a write operation,
activate via the select-lines at least one switch of the second group that is connected to at least one first access line to be selected for the write operation and not to activate the switch of the first group that is connected to this first access line; and
activate at least one of the switches of the first group that are connected to the first access lines that are adjacent to the first access line selected for the write operation, thereby enabling at least one discharge path.

8. The circuit arrangement according to claim 2, wherein the switches of the first group and the switches of the second group at least partially share the same active area.

9. The circuit arrangement according to claim 1, wherein the access controller comprises the first group of switches.

10. The circuit arrangement according to claim 1,
wherein two adjacent switches of the first group of switches are connected via their respective control terminal to different bit-lines;
wherein the two adjacent switches are connected via one of their respective controlled terminals to different first access lines,
wherein the two adjacent switches are connected to each other via an additional of their respective controlled terminals and further via at least one additional switch to the sense amplifier.

11. The circuit arrangement according to claim 10, wherein the additional switch is controlled by the access controller.

12. The circuit arrangement according to claim 1, wherein the access controller is arranged to activate only one of the at least two bit-lines at the same time.

13. The circuit arrangement according to claim 1, wherein the electronic component comprises at least one of:

a volatile memory cell selected from a group consisting of dynamic random access memory cells and static random access memory cells;
a non-volatile memory cell selected from a group consisting of flash memory cells and resistive memory cells; and a plurality of sensor elements;
a sensor element, the sensor element comprising a biosensor element.

14. The circuit arrangement of claim 1, wherein the switch comprises at least one field effect transistor.

15. The circuit arrangement of claim 14, wherein the field effect transistors are of the same conductivity type.

16. The circuit arrangement of claim 14, wherein the field effect transistors are at least partially arranged in the same well.

17. A method for operating a circuit arrangement,
wherein the circuit arrangement comprises
a plurality of electronic components; and
a plurality of first access lines and second access lines, wherein each electronic component is coupled with at least one first access line and second access lines, wherein the second access lines comprise at least two bit-lines;
the method comprising:
selecting a first access line;
controlling at least one first access line which is adjacent to the first access line selected to provide a discharge path.

18. The method according to claim 17,
wherein the least one first access line which is adjacent to the first access line selected is controlled to provide a discharge path by activating at least one switch of a first group of switches, wherein each switch comprises at least one control terminal and at least two controlled terminals,
wherein each switch of the first group of switches is connected
to one of the at least two bit-lines via its control terminal and
in a path between one first access line and a sense amplifier via its controlled terminals,
wherein adjacent switches of the first group of switches are connected via their control terminals to different bit-lines of the at least two bit-lines.

19. The method according to claim 17, wherein the discharge path is controlled to connect a level shifter to at least one first access line adjacent to the first access line selected.

20. The method according to claim 17, wherein the discharge path is controlled to connect a level shifter to at least one first access line adjacent to the first access line selected at the beginning of or during a read operation.

21. The method according to claim 18,
wherein the second access lines comprise select-lines,
wherein the circuit arrangement comprises a second group of switches, wherein each switch comprises at least one control terminal and at least two controlled terminals, wherein each switch of the second group of switches is connected
to one of the select-lines via its control terminal and
in a path between one first access line and a level shifter via its controlled terminals,
the method comprising the steps:
activating only the switches of the first group that are connected to one of the at least two bit-lines and not activating the switches of the first group that are connected to the at least other one of the at least two bit lines; and activating via the select-lines at least one switch of the second group that is connected to at least one first access line that is adjacent to the first access line that is selected for a read operation thereby enabling at least one discharge path adjacent to the switch of the first group that is selected for the read operation.

22. The method according to claim 18,
wherein the second access lines comprise select-lines,
wherein the circuit arrangement comprises a second group of switches, wherein each switch comprises at least one control terminal and at least two controlled terminals, wherein each switch of the second group of switches is connected
  to one of the select-lines via its control terminal and
  in a path between one first access line and a level shifter via its controlled terminals,
the method comprising:
  selecting at least one path from one first access line to the sense amplifier by activating at least one switch of the first group via at least one of the at least two bit lines; and
  activating via the select-lines at least one switch of the second group that is connected to at least one first access line that is adjacent to the first access line that is selected for a read operation, thereby enabling at least one discharge path adjacent to the switch of the first group that is selected for the read operation.

23. The method according to claim 17, wherein the discharge path is controlled to connect a sense amplifier to at least one first access line adjacent to the first access line selected.

24. The method according to claim 17, wherein the discharge path is controlled to connect a sense amplifier to at least one first access line adjacent to the first access line selected during a write operation.

25. The method according to claim 18,
wherein the second access lines comprise select-lines,
wherein the circuit arrangement comprises a second group of switches, wherein each switch comprises at least one control terminal and at least two controlled terminals, wherein each switch of the second group of switches is connected
  to one of the select-lines via its control terminal and
  in a path between one first access line and a level shifter via its controlled terminals,
the method comprising:
  activating via the select-lines at least one switch of the second group that is connected to at least one first access line to be selected for the write operation and not activating the switch of the first group that is connected to this first access line; and
  activating at least one of the switches of the first group that are connected to the first access lines that are adjacent to the first access line selected for the write operation thereby enabling at least one discharge path.

26. A circuit arrangement, comprising:
a plurality of electronic components;
a plurality of first access lines and second access lines, wherein each electronic component is coupled with at least one first access line and second access lines, wherein the second access lines comprise at least two bit-lines;
means for selecting a first access line; and
means for controlling at least one first access line which is adjacent to the first access line selected to provide a discharge path.

\* \* \* \* \*